US005742079A

United States Patent [19]
Doi

[11] Patent Number: 5,742,079
[45] Date of Patent: *Apr. 21, 1998

[54] INTEGRATED CIRCUIT WITH VARIABLE PAD PITCH

[75] Inventor: Bryan Cary Doi, Freemont, Calif.

[73] Assignee: VLSI Technology, Inc., San Jose, Calif.

[*] Notice: The term of this patent shall not extend beyond the expiration date of Pat. No. 5,610,417.

[21] Appl. No.: 773,099

[22] Filed: Dec. 24, 1996

Related U.S. Application Data

[60] Continuation of Ser. No. 415,183, Apr. 3, 1995, Pat. No. 5,610,417, which is a division of Ser. No. 142,839, Oct. 25, 1993, Pat. No. 5,424,248, which is a continuation of Ser. No. 805,418, Dec. 10, 1991, abandoned.

[51] Int. Cl.$^6$ .................... H01L 27/10; H01L 23/48; H01L 23/52
[52] U.S. Cl. .................... 257/203; 257/202; 257/796; 257/784; 438/128
[58] Field of Search .................... 257/202, 203, 257/786, 773, 784; 437/209, 205, 51, 52

[56] References Cited

U.S. PATENT DOCUMENTS

| | | | |
|---|---|---|---|
| 4,136,356 | 1/1979 | Kusano | 257/692 |
| 4,255,672 | 3/1981 | Ohno et al. | 257/207 |
| 4,523,106 | 6/1985 | Tanizawa et al. | 257/205 |
| 4,786,613 | 11/1988 | Gould et al. | 257/204 |
| 4,794,092 | 12/1988 | Solomon | 257/506 |
| 4,811,073 | 3/1989 | Kitamura et al. | 257/207 |
| 4,855,958 | 8/1989 | Ikeda | 257/211 |
| 4,945,395 | 7/1990 | Suehiro | 257/204 |
| 5,017,993 | 5/1991 | Shibata | 257/211 |
| 5,060,046 | 10/1991 | Shintani | 257/211 |
| 5,119,169 | 6/1992 | Kuzono et al. | 257/211 |
| 5,424,248 | 6/1995 | Doi | 437/209 |
| 5,510,654 | 4/1996 | Nishino et al. | 257/786 |
| 5,543,651 | 8/1996 | Sato | 257/786 |
| 5,610,417 | 3/1997 | Doi | 257/202 |

FOREIGN PATENT DOCUMENTS

| | | | |
|---|---|---|---|
| 3066620A1 | 3/1989 | European Pat. Off. | 27/2 |
| 0342590A2 | 11/1989 | European Pat. Off. | 23/48 |
| 4314490A1 | 6/1991 | European Pat. Off. | 23/48 |
| 6182756A | 9/1985 | Japan | 23/48 |
| 1185941 | 7/1989 | Japan | 257/202 |
| 3138972 | 6/1991 | Japan | 257/786 |
| 6084895 | 3/1994 | Japan | 257/786 |
| 6120426 | 4/1994 | Japan | 257/203 |

OTHER PUBLICATIONS

"IBM Technical Disclosure Bulletin" vol. 28 No. 8 Jan. 1986.Personalization of Driver Book Using Second-Level Metal.

*Primary Examiner*—Mahshid D. Saadat
*Assistant Examiner*—Jhihan B. Clark
*Attorney, Agent, or Firm*—Hickman Beyer & Weaver

[57] ABSTRACT

A method for making an integrated circuit characterized by: determining a range of bonding pad pitches which varies between a minimum bonding pad pitch and a maximum bonding pad pitch; setting a driver pitch to the minimum bonding pad pitch; forming a base set including a plurality of drivers having the determined driver pitch; forming customization layers over the base set, where the customization layers include a plurality of bonding pads having a pad pitch greater than the minimum bonding pad pitch but less than or equal to the maximum bonding pad pitch; and coupling some, but not all, of the drivers to the pads. As a result, a single base set can be used to make integrated circuits having a range of bonding pad pitches. The method and structure of the present invention are very well adapted for use in gate array integrated circuits.

16 Claims, 3 Drawing Sheets

INTEGRATED CIRCUIT WITH VARIABLE PAD PITCH

This is a continuation of application Ser. No. 08/415,183 filed on Apr. 3, 1995, now U.S. Pat. No. 5,610,417 which is a divisional of application Ser. No. 08/142,819 filed on Oct. 25, 1993, now U.S. Pat. No. 5,424,248, which is a continuation of Ser. No. 07/805,418 filed on Dec. 10, 1991, now abandoned.

BACKGROUND OF THE INVENTION

This invention relates generally to integrated circuits, and more particularly to the design and layout of gate array integrated circuits.

Gate arrays comprise hundreds or thousands of gates which can be selectively coupled together to perform user-specified tasks. The gates are formed in matrixes in a semiconductor substrate as part of a "base set". An end-user can customize a gate array by adding metal connect layers over the base set to couple the gates into complex, logical circuits.

In FIGS. 1 and 2, a typical, prior art gate array 10 includes a gate region 12, driver regions 14, and bonding pad regions 16. As best seen in FIG. 2, the gate array 10 is formed over a semiconductor substrate 18 (usually silicon). A number of base set layers 20 in conjunction with active devices formed in the substrate 18, provide a large matrix of logical gates within the gate region 12. These gates typically include AND gates, OR gates, and inverters, as well as more complex logical functions. The construction and operation of the base set 21 (comprising the layers 20 and the substrate 18) is well known to those skilled in the art.

The base sets of gate arrays are manufactured in mass production quantities and are stored until desired by an end-user. The base sets are relatively low cost devices because they are produced in these large volumes. When end-users have a requirement for a customized logic circuit, customization layers 22 can be added over the base set 21 to cause the gate array 10 to perform the required logical functions. These customization layers typically include an oxide layer 24, a metal layer 26, an oxide layer 28, and a metal layer 30. As best seen in FIG. 1, the metal layer 26 comprises a number of parallel conductors 32, and the metal layer 30 includes a number of parallel conductors 34. By selectively coupling the conductors 32 and 34 to the base set 21 by conductive vias (not shown) through the oxide layers 24 and 28, the gates of the base set can be coupled together to perform the user-defined logical functions. Methods for designing and producing the customization layers 22 are well known to those skilled in the art.

The base set 21 includes a plurality of drivers 36 in the driver regions 14. It should be noted that the driver 36 in FIG. 2 is highly representational: an actual driver would include active devices in the substrate 18 and interconnects in the layers 20. The drivers 36 are responsive to output signals developed within the gate array 10 and are operative to provide sufficient current to drive components external to the gate array 10. Each driver 36 of the base set 21 is coupled to a bonding pad 38 within bonding pad regions 16 by a via 40. These bonding pad are then coupled to leads of an integrated circuit package by any one of a number of well-known techniques such as wire bonding, tape automated bonding (TAB), flip-chip bonding, etc.

A particular base set can be used to produce logical circuits of varying complexity. Typically, the more complex the logical circuit, the more inputs and outputs are desired and, therefore, more bonding pads 38 are required. The number of bonding pads is increased by decreasing the "pitch" of the bonding pads, i.e. the center-to-center distance between adjacent bonding pads. However, the bonding pad pitch may be limited by the size of the gate array and by the bonding technique used. For example, a typical wire bond pitch may be 4.5 mils (thousandths of an inch), while a typical TAB bond pitch may be 4.0 mil.

Prior art drivers 36 are associated, one each, with the bonding pads 38. Therefore, the pitch of prior art drivers (i.e. the center-to-center distance between adjacent drivers 36) defines the pitch of the bonding pads 38. For example, if it is desirable to have bonding pad pitches at 4.8 mils and 4.5 mils for wire bonding and at 4.3 mils and 4.0 mils for TAB bonding, four different base sets 21 would be required, even if the gate array 10 were otherwise identical. Besides having to inventory four different base sets, the cost of each base set would be increased because fewer of each base set would be made.

The prior art has not, therefore, addressed the problem of providing a gate array base set which can accommodate a variable bonding pad pitch.

SUMMARY OF THE INVENTION

An integrated circuit in accordance with the present invention includes a base set provided with a plurality of drivers having a first pitch between adjacent centers, customization layers disposed over the base set, where the customization layers are provided with a plurality of bonding pads having a second pitch between adjacent centers, where the second pitch is greater than the first pitch, and vias for coupling some, but not all of the drivers to the pads. This structure is well adapted to gate arrays where a single base set can accommodate a range of bonding pad pitches.

A method for making an integrated circuit in accordance with the present invention includes determining a range of bonding pad pitches which varies between a minimum bonding pad pitch and a maximum bonding pad pitch, setting a driver pitch to the minimum bonding pad pitch, forming a base set including a plurality of drivers having the determined driver pitch, forming customization layers over the base set, where the customization layers include a plurality of bonding pads having a pad pitch greater than the minimum bonding pad pitch but less than or equal to the maximum bonding pad pitch, and coupling some, but not all, of the drivers to the pads.

An advantage of the present invention is that a single base set can be used to produce an integrated circuit having variable pad pitches. This results in economies of scale, increased efficiency, and reduced inventory of base sets.

These and other advantages of the present invention will become apparent to those skilled in the art upon a reading of the following specification of the invention and a study of the several figures of the drawing.

DETAILED DESCRIPTION OF THE PREFERRED EMBODIMENTS

Figure 1:
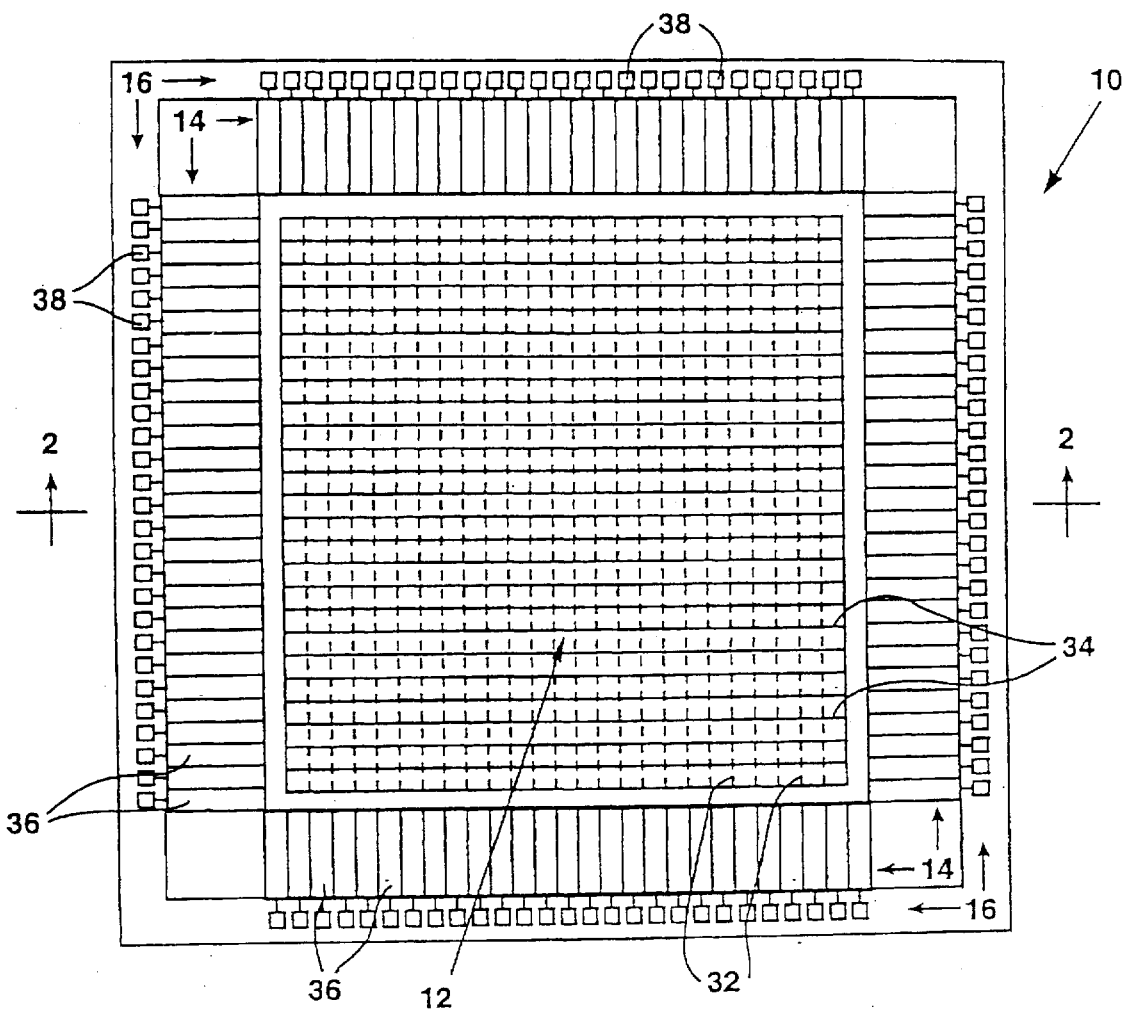
FIG. 1 is a top plan view of a prior art layout for a gate array.
Figure 2:
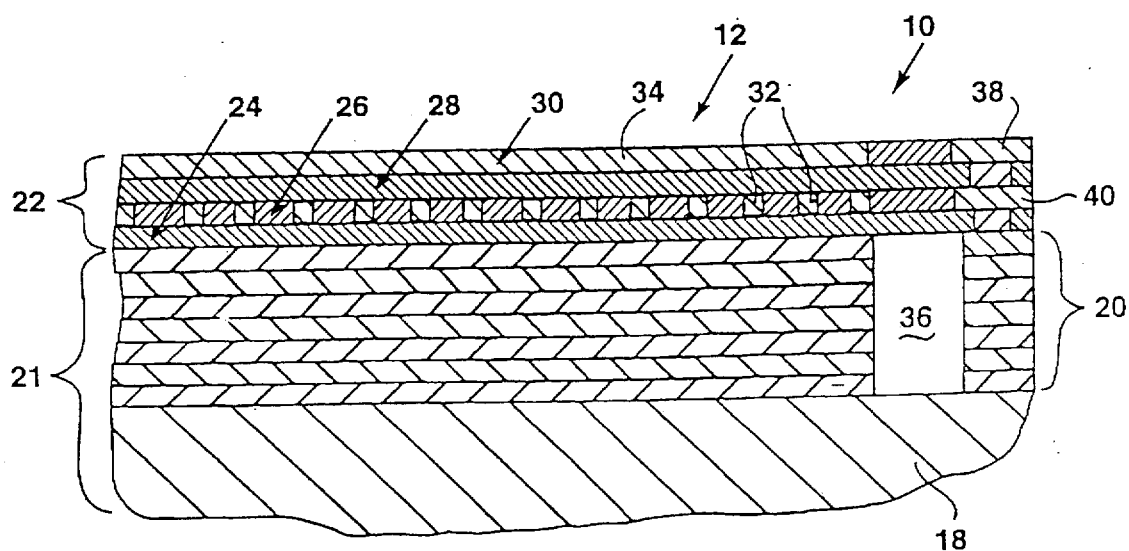
FIG. 2 is a partial cross sectional view taken along line 2—2 of FIG. 1.
Figure 3A:
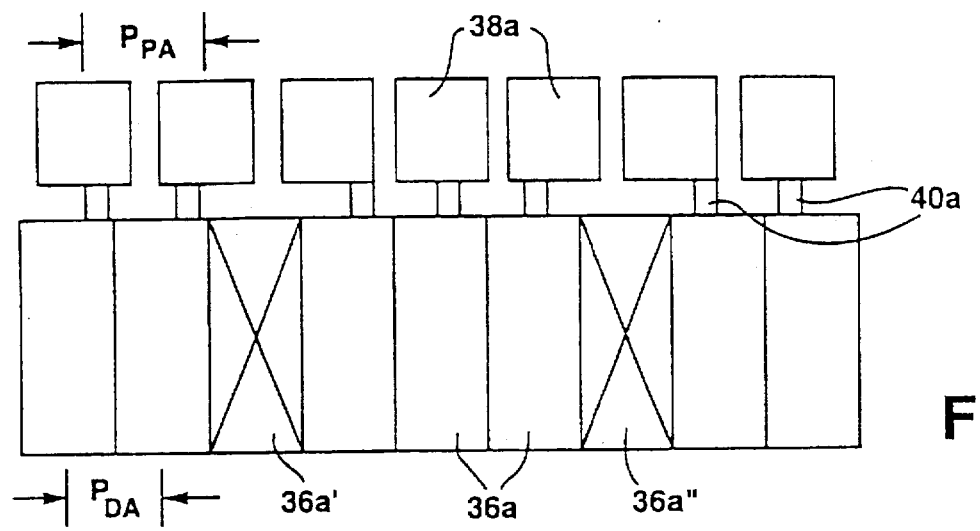
FIGS. 3a–3c illustrate three bonding pad pitches in accordance with the present invention.
Figure 3B:
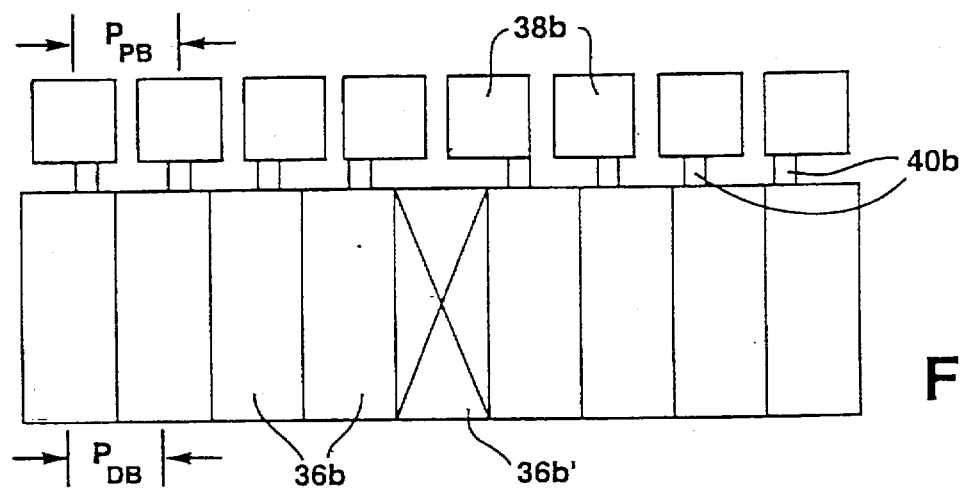

FIGS. 1 and 2 were used to illustrate a prior art gate array 10 well known to those skilled in the art. FIGS. 3a–3b will be used to illustrate a novel improvement to gate array 10 in accordance with the present invention.

In FIG. 3a, nine drivers 36a and seven bonding pads 38a are shown. The pitch $P_{DA}$ of the drivers 36a is, for example, 4 mils, while the pitch $P_{PA}$ of the pads 38a is, for example, 5 mils. Since the pitch of the pads 38a is greater than the pitch of the drivers 36a there is not enough space for there to be a one-to-one correspondence between the pads 38a and the drivers 36a. This leaves two drivers 36a' and 36a" unused for each set of nine drivers 36a. The seven remaining drivers 36a are coupled to the bonding pads 38a by vias 40a.

In FIG. 3b, nine drivers 36b and eight bonding pads 38b are shown. The pitch $P_{DB}$ of the drivers 36b is, for example, 4 mils, while the pitch $P_{PB}$ of the pads 38b is, for example, 4.5 mils. Again, since the pitch of the pads 38b is greater than the pitch of the drivers 36b there is not enough space for there to be a one-to-one correspondence between the pads 38b and the drivers 36b. In this instance, one driver 36b' is left unused for each set of nine drivers 36a. The eight remaining drivers 36b are coupled to the bonding pads 38b by vias 40b.

Figure 3C:
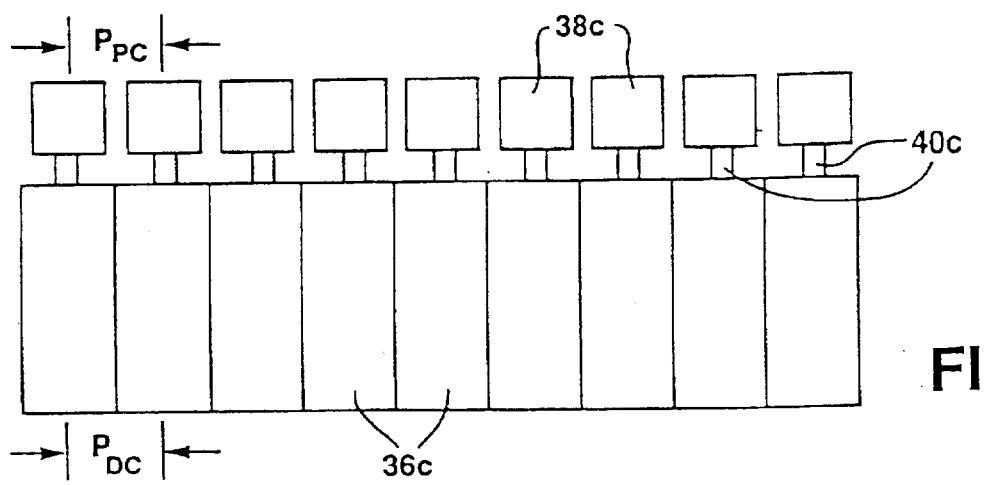

In FIG. 3c, nine drivers 36c and nine bonding pads 38c are shown. The pitch $P_{DC}$ of the drivers 36c and the $P_{PC}$ of the pads 38c are both, for example, 4 mils. Since the pitch of the pads 38c is equal to the pitch of the drivers 36c, there is a one-to-one correspondence between the pads 38c and the drivers 36c. In other words, all of the drivers 36c of this set of nine drivers is used. The drivers 36c are coupled to the bonding pads 38c by vias 40c.

It should be noted that the pitch of the drivers 36a, 36b, and 36c (collectively 36) is the same. Therefore, the base set 21 of which the drivers 36 are a part is the same. In consequence, the method and structure of the present invention allows for a variable bonding pad pitch with a fixed base set. This permits an economy of scale, efficiency, and flexibility of design which was lacking in prior art gate arrays where the bonding pad pitch was equal to the driver pitch.

Figure 4:
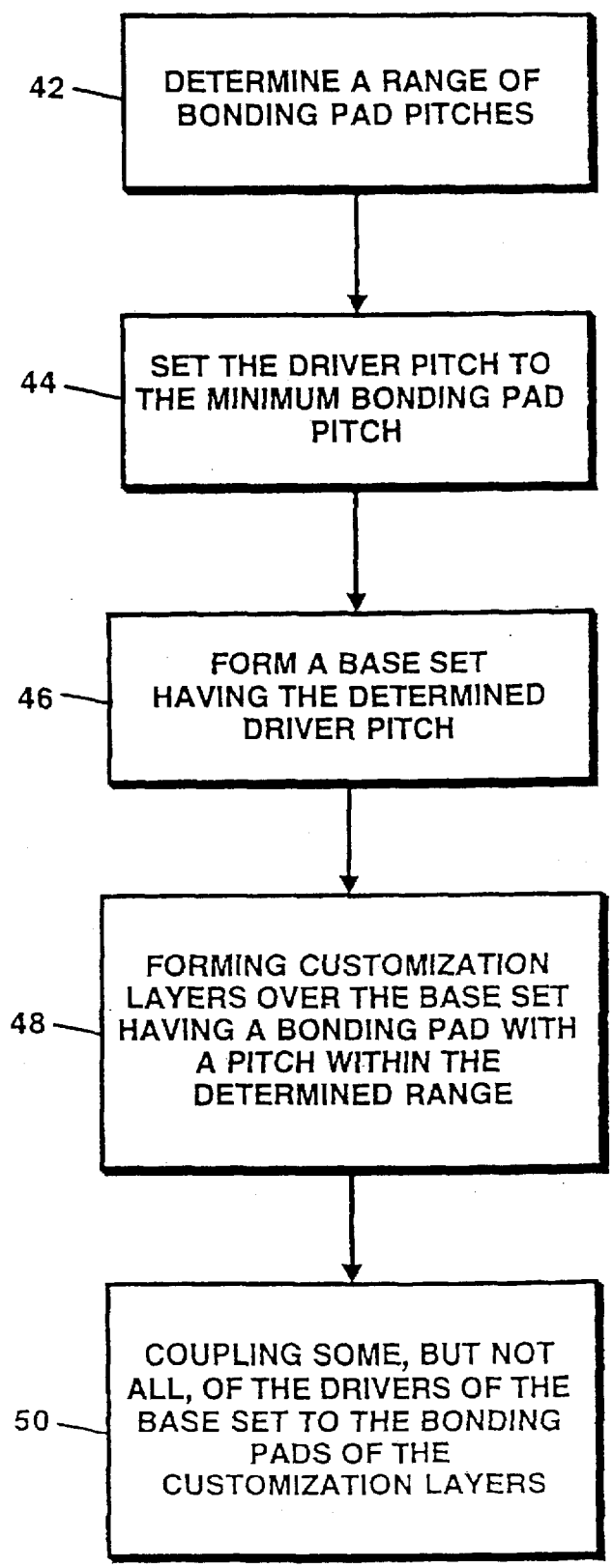
FIG. 4 is a flowchart of the method of the present invention.

FIG. 4 is a flowchart of a method for making an integrated circuit with variable pad pitch in accordance with the present invention. In a first step 42, a range of bonding pad pitches is determined. Using the example of FIGS. 3a–3c, a typical range may be from 4–5 mils. In a second step 44, the driver pitch is set to the minimum bonding pad pitch or, in this example, 4 mils. Next, in a step 46, a base set 21 is developed which provides drivers 36 having the minimum bonding pad pitch. This base set 21 will be used for all pad pitches within the determined range. The customization layers 22, including the bonding pads 38, are then formed over the base set 21 in a step 48. The pitch of the bonding pads should be within the predetermined range but should be significantly greater than the minimum bonding pad pitch. It will be apparent to those skilled in the art that if the actual bonding pad pitch is equal to the minimum bonding pad pitch and the driver pitch (such as in FIG. 3c), that the structure will be similar to that of the prior art gate array 10 of FIGS. 1 and 2. Finally, some, but not all, of the drivers 36 are coupled to the bonding pads 38 by vias 40.

A preferred range for the bonding pad pitch is between 5% and 95% of the minimum bonding pad pitch. Below 5%, there is not sufficient differentiation between the bonding pad pitch and the driver pitch to make a significant difference to the bonding process. Above 95%, every other driver will be unused, resulting in significant waste of space. However, there are circumstances when a bonding pad pitch outside of this preferred ranges is desirable.

While this invention has been described in terms of several preferred embodiments, it is contemplated that alterations, modifications and permutations thereof will become apparent to those skilled in the art upon a reading of the specification and study of the drawings. It is therefore intended that the following appended claims include all such alterations, modifications and permutations as fall within the true spirit and scope of the present invention.

What is claimed is:

1. An integrated circuit comprising:
   a base structure provided with a plurality of drivers having a first pitch between adjacent centers of said drivers;
   a customization structure disposed over said base structure, said customization structure being provided with a plurality of bonding pads having a second pitch between adjacent centers of said bonding pads, wherein said second pitch is greater than said first pitch; and
   a coupling structure connecting some, but not all, of said drivers to said bonding pads.

2. An integrated circuit comprising:
   a semiconductor substrate including active devices formed therein;
   a base layer disposed over said substrate for providing a plurality of drivers connected with said active devices and having a first pitch between adjacent centers of said drivers;
   a customization layer disposed over said base layer for providing a plurality of bonding pads having a second pitch between adjacent centers of said pads, wherein said second pitch is greater than said first pitch; and
   a coupling structure connecting some, but not all, of said drivers to said pads, thereby at least one of said drivers not being coupled to any bonding pad of the integrated circuit.

3. An integrated circuit as recited in claim 2 wherein said integrated circuit comprises a gate array, said base layer comprises a base set of layers, and said customization layer comprises metal connect layers.

4. An integrated circuit as recited in claim 2 wherein said second pitch is at least 5% greater than said first pitch.

5. An integrated circuit as recited in claim 2 wherein said second pitch is between about 5% and 95% greater than said first pitch.

6. An integrated circuit as recited in claim 2 wherein said for coupling said drivers to said pads include vias.

7. An integrated circuit comprising:
   a semiconductor substrate including active devices formed therein, said semiconductor substrate defining four sides of an integrated circuit chip;
   a base layer disposed above said semiconductor substrate for providing a plurality of drivers, said plurality of drivers comprising four sets of drivers connected with said active devices, each set of said four sets of drivers being arranged at a respective side of said four sides of said integrated circuit chip, said each set of said four sets of drivers having all of its drivers arranged in a single row, said drivers of said four sets of drivers having a first pitch between adjacent centers of said drivers;
   a customization layer disposed over said base layer for providing a plurality of bonding pads, said plurality of bonding pads comprising four sets of bonding pads, each set of said four sets of bonding pads being arranged at a respective side of said four sides of said integrated circuit chip, said each set of said four sets of bonding pads having all of its bonding pads arranged in a single row and thereby each side of said four sides of the integrated circuit having exclusively only one single row of bonding pads arranged thereat, said bonding pads of said four sets of bonding pads having a second pitch between adjacent centers of said bonding pads, wherein said second pitch is greater than said first pitch; and a plurality of conductive structures extending between some, but not all, of said drivers to said bonding pads, thereby at least one of said drivers not being coupled to any bonding pad of the integrated circuit.

8. An integrated circuit as recited in claim 7 wherein said integrated circuit comprises a gate array, said base layer comprises a base set of layers, and said customization layer comprises metal connect layers.

9. An integrated circuit as recited in claim 7 wherein said second pitch is at least 5% greater than said first pitch.

10. An integrated circuit as recited in claim 7 wherein said second pitch is between about 5% and 95% greater than said first pitch.

11. An integrated circuit as recited in claim 10 wherein said for coupling said drivers to said pads include vias.

12. An integrated circuit comprising:

a semiconductor substrate including active devices formed therein;

a base layer means disposed above said semiconductor substrate for providing a plurality of I/O drivers connected with said active devices and arranged at a peripheral portion of said periphery of the integrated circuit, all of the drivers of said plurality of drivers being arranged in a single row at said peripheral portion, and said drivers having a first pitch between adjacent centers of said drivers;

a customization layer means disposed over said base layer means for providing a plurality of I/O bonding pads arranged at said peripheral portion, all of the bonding pads of said plurality of bonding pads being arranged in one single row at said peripheral portion and thereby said peripheral portion having exclusively only said one single row of bonding pads without any bonding pads not being arranged in said one single row at said peripheral portion, said bonding pads having a second pitch between adjacent centers of said bonding pads arranged in said one single row at said peripheral portion, wherein said second pitch is greater than said first pitch; and means for coupling some, but not all, of said drivers to said bonding pads, thereby at least one of said drivers not being coupled to any bonding pad of the integrated circuit at said peripheral portion thereof.

13. An integrated circuit as recited in claim 12 wherein said integrated circuit comprises a gate array, said base layer means comprises a base set of layers, and said customization layer means comprises metal connect layers.

14. An integrated circuit as recited in claim 12 wherein said second pitch is at least 5% greater than said first pitch.

15. An integrated circuit as recited in claim 12 wherein said second pitch is between about 5% and 95% greater than said first pitch.

16. An integrated circuit as recited in claim 12 wherein said means for coupling said drivers to said pads include vias.

* * * * *